(12) United States Patent
Jang et al.

(10) Patent No.: US 12,342,524 B2
(45) Date of Patent: Jun. 24, 2025

(54) METHOD FOR FABRICATING SEMICONDUCTOR DEVICE AND SEMICONDUCTOR DEVICE

(71) Applicant: CHANGXIN MEMORY TECHNOLOGIES, INC., Hefei (CN)

(72) Inventors: Semyeong Jang, Hefei (CN); Joonsuk Moon, Hefei (CN); Deyuan Xiao, Hefei (CN); Jo-Lan Chin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 442 days.

(21) Appl. No.: 17/893,058

(22) Filed: Aug. 22, 2022

(65) Prior Publication Data

US 2023/0345697 A1    Oct. 26, 2023

Related U.S. Application Data

(63) Continuation of application No. PCT/CN2022/098253, filed on Jun. 10, 2022.

(30) Foreign Application Priority Data

Apr. 26, 2022  (CN) .......................... 202210451603.8

(51) Int. Cl.
H10B 12/00         (2023.01)

(52) U.S. Cl.
CPC ........... *H10B 12/05* (2023.02); *H10B 12/315* (2023.02)

(58) Field of Classification Search
CPC .............................. H10B 12/05; H10B 12/315
See application file for complete search history.

(56) References Cited

U.S. PATENT DOCUMENTS 10,388,659 B2    8/2019  Zhang
10,546,862 B1 *  1/2020  Yang ................ H01L 21/76831
(Continued)

FOREIGN PATENT DOCUMENTS

CN    101897008 A    11/2010
CN    102779828 A    11/2012
(Continued)

OTHER PUBLICATIONS

ISA State Intellectual Property Office of the People's Republic of China, International Search Report Issued in Application No. PCT/CN2022/111403, Jan. 16, 2023, WIPO, 4 pages.
(Continued)

*Primary Examiner* — Shih Tsun A Chou
*Assistant Examiner* — Jonathan Keith Little
(74) *Attorney, Agent, or Firm* — Kilpatrick Townsend & Stockton LLP

(57) ABSTRACT

A semiconductor structure and a fabricating method are provided. The semiconductor structure includes a substrate, active pillars, gate structures, a metal silicide layer, and a spacer. The active pillars are positioned on the substrate and are arranged in an array, and the active pillars extend along a direction perpendicular to the substrate. The gate structures are arranged at intervals along a first direction, and the gate structures are arranged surrounding a part of the active pillars. The metal silicide layer is positioned on a top surface of the active pillar, and a projection of the metal silicide layer on the substrate is overlapped with a projection of the top surface of the active pillar on the substrate. The spacer is positioned between adjacent gate structures and adjacent active pillars, and a height of the spacer is higher than a height of a top surface of the metal silicide layer.

10 Claims, 9 Drawing Sheets

(56) References Cited

U.S. PATENT DOCUMENTS

| | | |
|---|---|---|
| 11,069,679 B2 | 7/2021 | Wu et al. |
| 2008/0251825 A1 | 10/2008 | Lee |
| 2011/0012085 A1 | 1/2011 | Deligianni et al. |
| 2011/0121396 A1 | 5/2011 | Lee |
| 2013/0234240 A1 | 9/2013 | Moon et al. |
| 2013/0323920 A1 | 12/2013 | Chang et al. |
| 2016/0247892 A1 | 8/2016 | Masuoka et al. |
| 2018/0248018 A1* | 8/2018 | Park .................. H10D 30/6728 |
| 2019/0035795 A1 | 1/2019 | Boemmels |
| 2019/0067459 A1 | 2/2019 | Balakrishnan et al. |
| 2022/0037483 A1 | 2/2022 | Lowe |

FOREIGN PATENT DOCUMENTS

| | | |
|---|---|---|
| CN | 103904115 A | 7/2014 |
| CN | 109216278 A | 1/2019 |
| CN | 109712976 B | 2/2021 |
| CN | 113838802 A | 12/2021 |
| CN | 114141712 A | 3/2022 |
| CN | 114203806 A | 3/2022 |
| CN | 114784006 A | 7/2022 |

OTHER PUBLICATIONS

ISA State Intellectual Property Office of the People's Republic of China, International Search Report Issued in Application No. PCT/CN2022/109754, Jan. 17, 2023, WIPO, 4 pages.

United States Patent and Trademark office, non-final office action issued in related U.S. Appl. No. 17/932,418, mailed on Mar. 27, 2025.

United States Patent and Trademark office, non-final office action issued in related U.S. Appl. No. 17/934,655, mailed on Mar. 28, 2025.

* cited by examiner

METHOD FOR FABRICATING SEMICONDUCTOR DEVICE AND SEMICONDUCTOR DEVICE

CROSS-REFERENCE TO RELATED APPLICATION

The present disclosure is a continuation of PCT/CN2022/098253, filed on Jun. 10, 2022, which claims priority to Chinese Patent Application No. 202210451603.8, titled "SEMICONDUCTOR STRUCTURE AND FABRICATION METHOD THEREOF, AND SEMICONDUCTOR DEVICE" and filed on Apr. 26, 2022, the entire contents of which are incorporated herein by reference.

TECHNICAL FIELD

The present disclosure relates to the field of semiconductor manufacturing technologies, and in particular, to a semiconductor structure, a method for fabricating a semiconductor structure, and a semiconductor device.

BACKGROUND

As a semiconductor memory device commonly used in computers, dynamic random access memory (DRAM) includes many repeated memory cells. At present, a DRAM with a $4F^2$ cell structure and a vertical channel transistor has been developed. Contact between a source/drain of the transistor and a memory cell is implemented in a manner where a silicon-containing active pillar is in direct contact with a metal layer of the memory cell. However, due to large resistance of the silicon pillar, contact resistance between the active pillar and the memory cell is larger, which reduces an operating speed of the semiconductor device, and degrades performance of the semiconductor device.

SUMMARY

Embodiments of the present disclosure provide a semiconductor structure and a semiconductor device, where a metal silicide layer has smaller contact resistance, such that an operating speed can be improved and energy consumption can be reduced.

The embodiments of the present disclosure also provide a method for fabricating a semiconductor structure, which can reduce the contact resistance of an active pillar and improve the operating speed of the semiconductor structure.

According to an aspect of the present disclosure, there is provided a semiconductor structure, which includes: a substrate, active pillars, gate structures, a metal silicide layer, and a spacer. The active pillars are positioned on the substrate and are arranged in an array, and the active pillars extend along a direction perpendicular to the substrate. The gate structures are positioned on the substrate, the gate structures are arranged at intervals along a first direction, and the gate structures are arranged surrounding a part of the active pillars. The metal silicide layer is positioned on a top surface of the active pillar, and a projection of the metal silicide layer on the substrate is overlapped with a projection of the top surface of the active pillar on the substrate. The spacer is positioned between adjacent gate structures and adjacent active pillars, and a height of the spacer is higher than a height of a top surface of the metal silicide layer.

According to another aspect of the present disclosure, a method for fabricating a semiconductor structure is provided. The method includes: providing a substrate, where active pillars are arranged in an array on the substrate, and the active pillars extend along a direction perpendicular to the substrate; forming gate structures positioned on the substrate, where the gate structures are arranged at intervals along a first direction, and are arranged surrounding a part of the active pillar; forming a spacer, where the spacer is formed between adjacent two of the gate structures and adjacent two of the active pillars, and a height of the spacer is higher than a height of a top surface of the active pillar; and forming a metal silicide layer, where the metal silicide layer is positioned on the top surface of the active pillar, and a projection of the metal silicide layer on the substrate is overlapped with a projection of the top surface of the active pillar on the substrate.

According to another aspect of the present disclosure, a semiconductor device is provided, including: the semiconductor structure according to any one of the above embodiments and a memory cell, where the memory cell is electrically connected to the semiconductor structure by means of a connection layer.

As can be seen from the above technical solutions, the present disclosure has at least one of following advantages and beneficial effects.

A top surface of the active pillar of the semiconductor structure in the embodiments of the present disclosure has a metal silicide layer, which has smaller resistance. Therefore, the active pillar of the present disclosure is in contact with a metal pad by means of the metal silicide layer, which reduces contact resistance, reduces energy consumption, and improves an operating speed of the semiconductor structure.

BRIEF DESCRIPTION OF THE DRAWINGS

The above and other features and advantages of the present disclosure will become more apparent from the detailed description of exemplary embodiments with reference to the drawings, in which.

Figure 1:
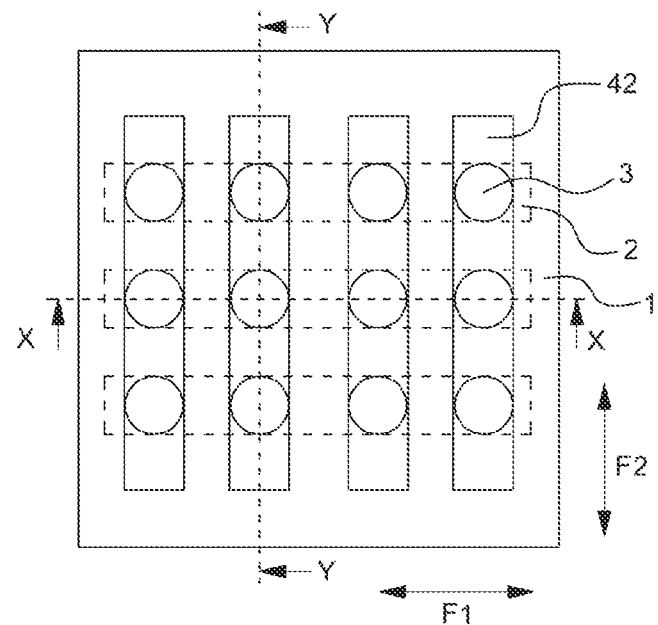
FIG. 1 is a top view of a semiconductor structure according to an exemplary embodiment of the present disclosure.

Reference numerals in the attached drawings:
1—substrate; 2—bit line; 21—metal silicide region; 3—active pillar; 31—first pillar; 4—gate structure; 41—gate insulating layer; 411—first insulating layer; 412—second insulating layer; 42—word line layer; 421—word line metal layer; 5—metal silicide layer; 51—first metal layer; 6—spacer; 61—first spacer; 62—second spacer; 7—connection layer; 71—connection material layer; F1—first direction; F2—second direction; and G—groove.

DETAILED DESCRIPTION

Exemplary embodiments will now be described more comprehensively with reference to the accompanying drawings. However, the exemplary embodiments may be carried out in various manners, and shall not be interpreted as being limited to the embodiments set forth herein; instead, providing these embodiments will make the present disclosure more comprehensive and complete, and will fully convey the conception of the exemplary embodiments to those skilled in the art. Throughout the drawings, similar reference signs indicate the same or similar structures, and thus their detailed description will be omitted.

In the following description of different exemplary embodiments of the present disclosure, it is made with reference to the accompanying drawings, which form a part of the present disclosure, and therein different exemplary structures that can implement various aspects of the present disclosure are shown by way of example. It should be understood that other solutions of components, structures, exemplary apparatuses, systems, and steps may be used, and structural and functional modifications may be made without departing from the scope of the present disclosure. Moreover, although the terms "above", "between", "within", etc. may be used in this specification to describe different exemplary features and elements of the present disclosure, these terms are used herein for convenience only, such as directions of the examples in the drawings. Nothing in this specification should be understood as requiring a three-dimensional direction of the structure to fall within the scope of the present disclosure. In addition, the terms "first", "second", etc. in the claims are used only as marks, and are not numerical limitations on their objects.

The flowcharts as shown in the accompanying drawings are merely exemplary description instead of necessarily including all the contents and operations/steps, or necessarily having to be performed in the order set forth. For example, some operations/steps may be broken down, while some operations/steps may be combined or partly combined. Therefore, the actual execution sequences may be changed according to the actual conditions.

In addition, in the description of the present disclosure, "a plurality of" refers to at least two, for example, two, three, etc., unless otherwise expressly specified. The terms "above" and "below" are technical terms indicating orientations, which are intended only for clearer description rather than limitation.

In the related art, a semiconductor substrate has an active area and a pad, the active area is provided with a transistor, and the pad is electrically connected to a source/drain in the transistor, to provide a circuit for a semiconductor structure and to electrically connect the transistor and a memory cell. The source/drain in the related art is generally made of a silicon-containing active area material, which has large resistance, and therefore has large contact resistance with the pad.

Figure 2:
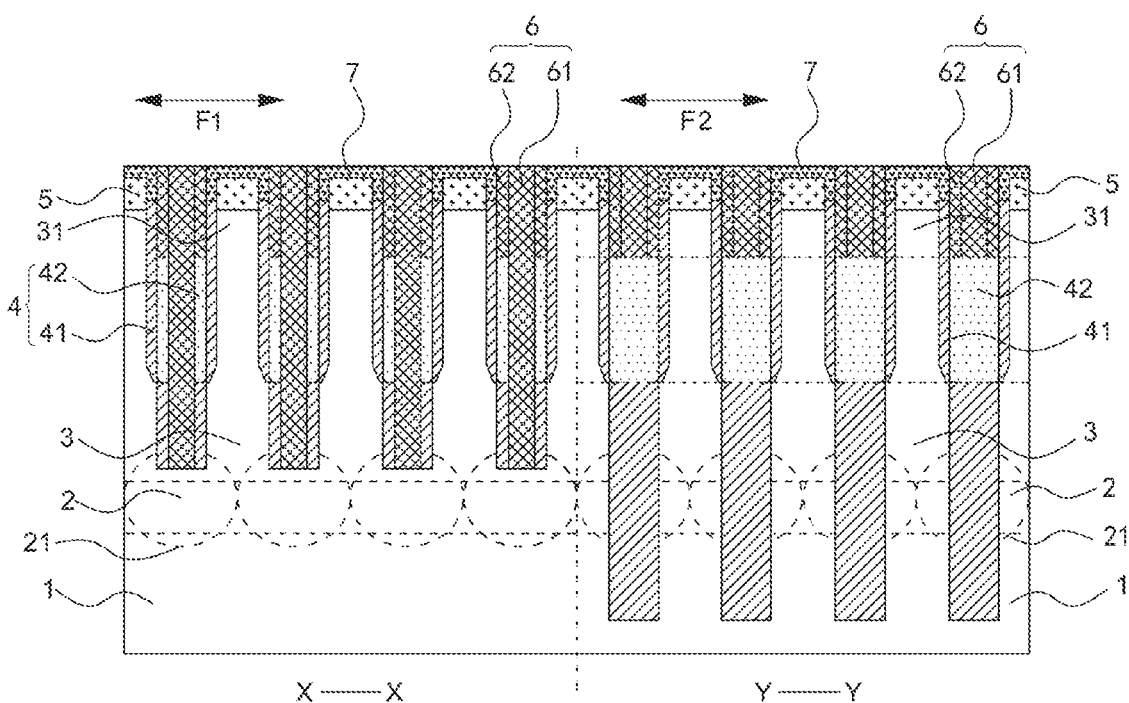
FIG. 2 is a cross-sectional view of the semiconductor structure along lines X-X and Y-Y of FIG. 1.

According to an aspect of the present disclosure, there is provided a semiconductor structure. As shown in FIG. 1 and FIG. 2, FIG. 1 shows a top view of a semiconductor structure according to an embodiment of the present disclosure, and FIG. 2 shows a cross-sectional view of the semiconductor structure along lines X-X and Y-Y of FIG. 1, respectively. As shown in FIG. 1 and FIG. 2, the semiconductor structure in the embodiment of the present disclosure includes: a substrate 1, active pillars 3, gate structures 4, a metal silicide layer 5, and a spacer 6. The active pillars 3 are positioned on the substrate 1 and are arranged in an array, and the active pillars 3 extend along a direction perpendicular to the substrate 1. The gate structures 4 are positioned on the substrate 1, the gate structures 4 are arranged at intervals along a first direction F1, and the gate structures 4 are arranged surrounding a part of the active pillars 3. The metal silicide layer 5 is positioned on a top surface of the active pillar 3, and a projection of the metal silicide layer 5 on the substrate 1 is overlapped with a projection of the top surface of the active pillar 3 on the substrate 1. The spacer 6 is positioned between adjacent gate structures 4 and adjacent active pillars 3, and a height of the spacer 6 is higher than a height of a top surface of the metal silicide layer 5.

A top surface of the active pillar 3 of the semiconductor structure in the embodiments of the present disclosure has the metal silicide layer 5, and the metal silicide layer 5 has smaller resistance. Therefore, the active pillar 3 of the present disclosure is in contact with a metal pad by means of the metal silicide layer 5, which reduces contact resistance, reduces energy consumption, and improves an operating speed of the semiconductor structure.

The semiconductor structure in the embodiments of the present disclosure is described in detail below.

In the embodiments of the present disclosure, "on" and "below" are orientation words indicating relative positions. For example, in FIG. 2, the active pillar 3 is positioned on the substrate 1, so the substrate 1 is positioned below the active pillar 3. The orientation words are intended only for clarity rather than limitation.

As shown in FIG. 1 and FIG. 2, a material of the substrate 1 in the embodiments of the present disclosure may be silicon, silicon carbide, silicon nitride, silicon-on-insulator, stacked silicon-on-insulator, stacked silicon-germanium-on-insulator, silicon-germanium-on-insulator, germanium-on-insulator, or the like.

In some embodiments, shallow trench isolations (not shown in the figure) are formed in the substrate 1, and an active area is provided between the shallow trench isolations. A bit line 2 is connected to the active area. The active pillar 3 in the embodiments of the present disclosure is formed by etching the substrate 1. That is, the active pillar 3 and the substrate 1 may be integrally formed, and the active pillar 3 is positioned in the active area of the substrate 1. To make the description clearer, a substrate part below the active pillar 3 may be named the substrate 1.

In some embodiments, a metal element of the metal silicide layer 5 includes at least one of Co, Ni, Pt, Ti, Ta, Mo, and W, which can be bonded with silicon in the substrate 1 to form a stable metal silicide, to reduce resistance.

In some embodiments, as shown in FIG. 2, the gate structure 4 includes a gate insulating layer 41, and the gate insulating layer 41 is arranged surrounding a side surface of the active pillar 3. In the direction perpendicular to the substrate 1, a top surface of the gate insulating layer 41 is lower than the top surface of the metal silicide layer 5. The gate insulating layer 41 may include at least one of silicon oxide, silicon nitride, and silicon oxynitride.

The gate structure 4 further includes a word line layer 42, which is arranged surrounding a part of a side surface of the gate insulating layer 41. As shown in FIG. 1, word line layers 42 are arranged at intervals in a first direction F1, and each word line layer 42 extends along a second direction F2. The word line layer 42 arranged surrounding the surface of the gate insulating layer 41 may be used as a gate electrode, that is, the gate electrode may be a part of the word line layer 42. In some embodiments, a material of the word line layer 42 may include at least one of TiN, W, Al, Cu, and Au.

As shown in FIG. 2, in the direction perpendicular to the substrate 1, the top surface of the gate insulating layer 41 is lower than that of the metal silicide layer 5. That is, the gate insulating layer 41 forms a groove on a periphery of the metal silicide layer 5. At least a part of a connection layer 7 may be positioned in the groove, such that the connection layer 7 and the active pillar 3 are connected more stably.

In some embodiments, a distance between the top surface of the gate insulating layer 41 and the top surface of the metal silicide layer 5 is 5 nm to 40 nm, that is, a depth of the groove is 5 nm to 40 nm. In some embodiments, other than the two end values of the range, a value of the distance may be 25 nm, 30 nm, 35 nm, or 38 nm, or the distance between the top surface of each gate insulating layer 41 and the top surface of the metal silicide layer 5 may vary in the range of 5 nm to 40 nm with different positions. That is, each groove does not have a uniform depth, and each groove may have different depths at different positions. Persons skilled in the art may select a value according to actual needs, which is not particularly limited herein. In some embodiments, a bottom surface of the groove is higher than a bottom surface of the metal silicide layer 5 (the bottom surface of the metal silicide layer 5 close to the substrate 1), to prevent contact between the connection layer 7 and a part of the active pillar 3, such that the connection layer 7 is in full contact with the metal silicide layer 5, which reduces a contact resistance, increases a contact area between the connection layer 7 and the metal silicide layer 5, and improves an operating speed of the semiconductor structure.

In some embodiments, as shown in FIG. 2, the semiconductor structure further includes the connection layer 7. The connection layer 7 is positioned on the metal silicide layer 5, and a projection of the connection layer 7 on the substrate 1 covers a projection of the metal silicide layer 5 on the substrate 1. The connection layer 7 may be a pad metal, which is electrically connected to the metal silicide layer 5 on the active pillar 3. The metal silicide layer 5 is electrically connected to a memory cell by means of the connection layer 7. In some embodiments, a material of the connection layer 7 may be at least one of TiN, W, Al, Cu, and Au.

In some embodiments, as shown in FIG. 2, the spacer 6 extends along the direction perpendicular to the substrate 1, and a top surface of the spacer 6 is flush with a top surface of the connection layer 7, to facilitate arrangement of the memory cell in a subsequent process.

In some embodiments, the semiconductor structure further includes bit lines 2. As shown in FIG. 1, the bit lines 2 are positioned in the substrate 1, and are arranged at intervals along the second direction F2. The first direction F1 is not parallel to the second direction F2. As shown in FIG. 1, the first direction F1 is perpendicular to the second direction F2. A material of the bit line 2 includes a metal silicide. As shown in FIG. 2, a region indicated by a dashed ellipse is a metal silicide region 21, that is, a region where the metal silicide in the bit line 2 is distributed. The bit line 2 in the embodiment of the present disclosure is a buried bit line, which is formed by injecting impurity ions into the substrate 1. Because the bit line 2 formed only by injecting the impurity ions is not metal but a silicon wiring doped with the impurity ions, the bit line 2 has higher resistance. To reduce the resistance of the bit line 2, the bit line 2 in the embodiments of the present disclosure includes a metal silicide. The metal silicide has lower resistance, which can reduce the resistance of the bit line 2, thereby reducing power consumption of the semiconductor structure during operation.

To sum up, the top surface of the active pillar 3 of the semiconductor structure in the embodiments of the present disclosure has the metal silicide layer 5, which has smaller resistance. Therefore, the active pillar 3 of the present disclosure is in contact with a metal pad (the connection layer 7) by means of the metal silicide layer 5, which reduces the contact resistance, reduces the energy consumption, and improves the operating speed of the semiconductor structure.

Figure 3:
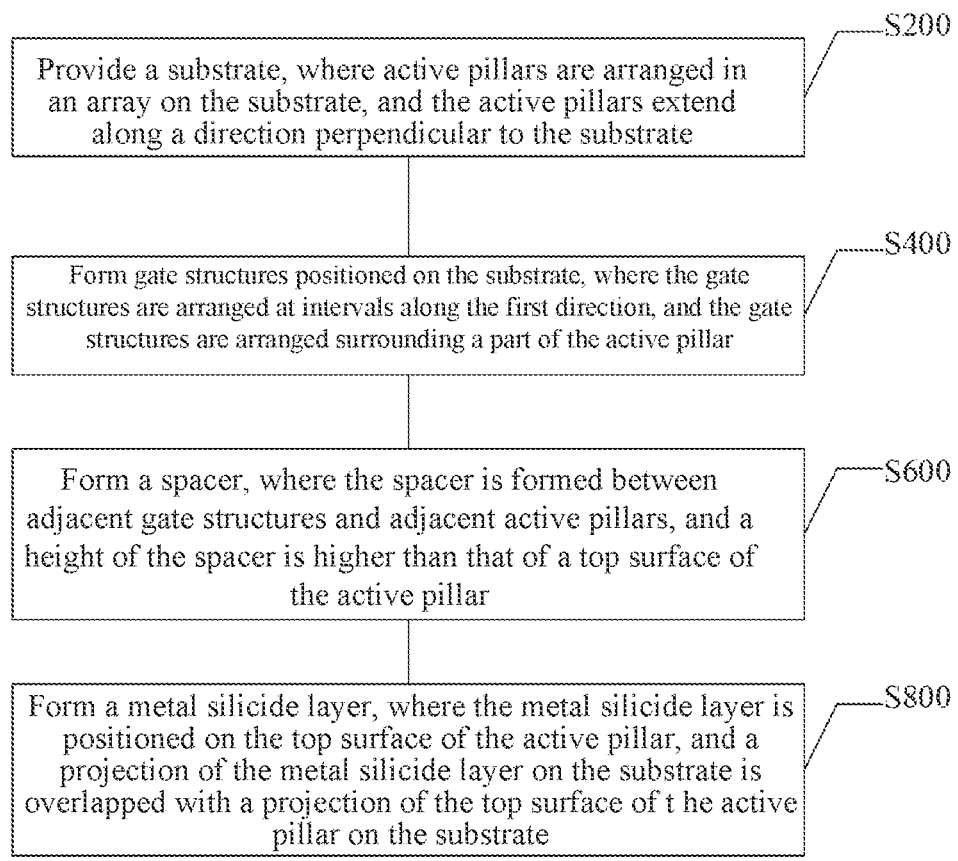
FIG. 3 is a flowchart of a method for fabricating a semiconductor structure according to an exemplary embodiment of the present disclosure.

According to another aspect of the present disclosure, a method for fabricating a semiconductor structure is provided. As shown in FIGS. 3 to 17, FIG. 3 is a flowchart of a method for fabricating a semiconductor structure, and FIGS. 4 to 17 are schematic structural diagrams of the semiconductor structure in fabrication processes. As shown in FIG. 3, the method for fabricating a semiconductor structure provided by an embodiment of the present disclosure includes following steps.

Step S200: providing a substrate 1, where active pillars 3 are arranged in an array on the substrate 1, and the active pillars 3 extend along a direction perpendicular to the substrate 1.

Step S400: forming gate structures 4 positioned on the substrate 1, where the gate structures 4 are arranged at intervals along the first direction F1, and the gate structures 4 are arranged surrounding a part of the active pillar 3.

Step S600: forming a spacer 6, where the spacer 6 is formed between adjacent gate structures 4 and adjacent active pillars 3, and a height of the spacer 6 is higher than that of a top surface of the active pillar 3.

Step S800: forming a metal silicide layer 5, where the metal silicide layer 5 is positioned on the top surface of the active pillar 3, and a projection of the metal silicide layer 5 on the substrate 1 is overlapped with a projection of the top surface of the active pillar 3 on the substrate 1.

In the method for fabricating a semiconductor structure in the embodiments of the present disclosure, the metal silicide layer 5 is formed on the top surface of the active pillar 3, which can reduce the contact resistance of the active pillar 3, and improve the operating speed of the semiconductor structure.

The method for fabricating a semiconductor structure in the embodiments of the present disclosure is described in detail below.

Step S200: providing a substrate 1, where active pillars 3 are arranged in an array on the substrate 1, and the active pillars 3 extend along a direction perpendicular to the substrate 1.

Figure 4:
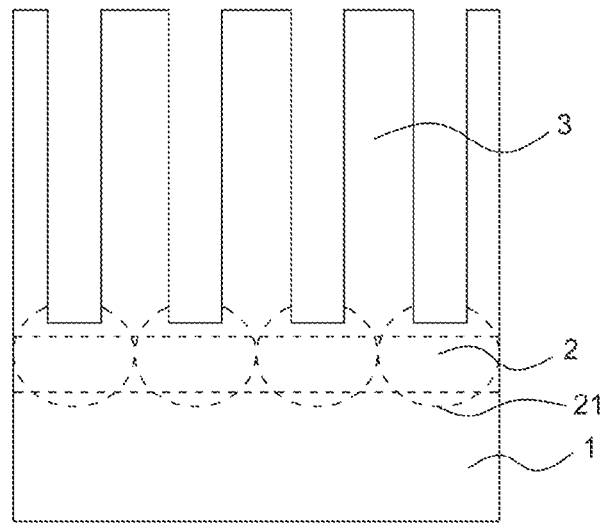
FIGS. 4 to 17 are schematic diagrams of the semiconductor structure in fabrication processes according to exemplary embodiments of the present disclosure.

As shown in FIG. 4, the substrate 1 is provided, a mask layer (not shown in the figure) is formed on the substrate 1, and active pillar patterns arranged in an array are formed on the mask layer. According to the active pillar patterns, the substrate 1 is etched by means of an etching process to form the active pillars 3 arranged in an array. In some embodiments, the etching process may be a wet etching process. During the wet etching, concentrated sulfuric acid and hydrogen peroxide may be used as an etchant, and an etching depth is adjusted by regulating a concentration and a ratio of the etchant, to regulate the height of the active pillar 3. In some embodiments, the etching process may be a dry etching process. The dry etching has good shape retention and can form vertical active pillars.

In some embodiments, the substrate 1 is a silicon substrate, and the active pillar 3 is a silicon pillar.

Step S400: forming gate structures 4 positioned on the substrate 1, where the gate structures 4 are arranged at intervals along the first direction F1, and the gate structures 4 are arranged surrounding a part of the active pillar 3. In some embodiments, Steps S401 and S402 may be included.

Figure 5:
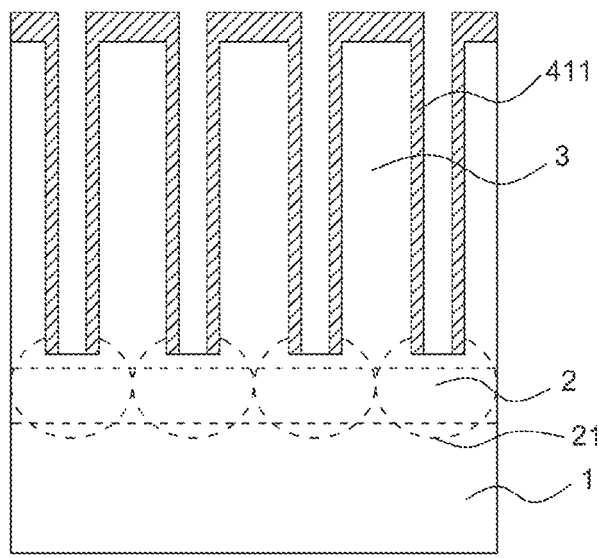
Figure 6:
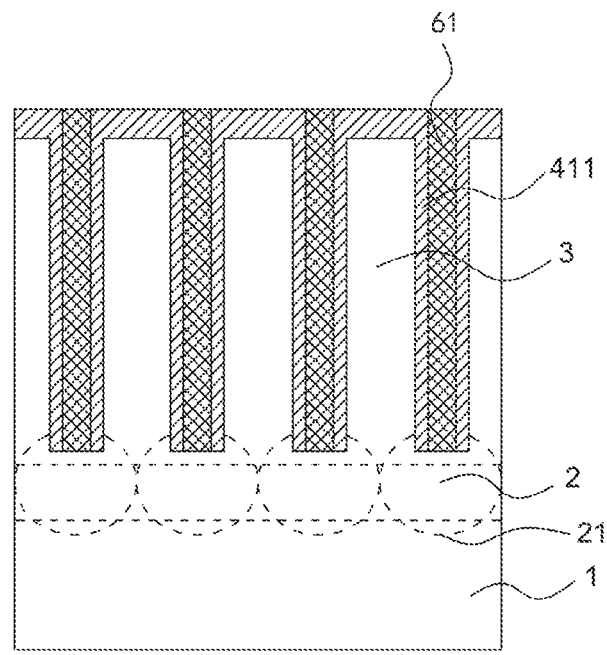
Figure 7:
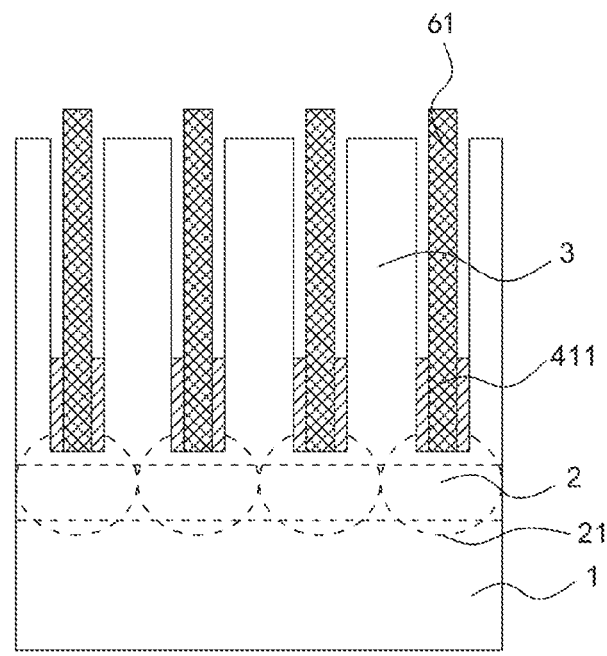
Figure 8:
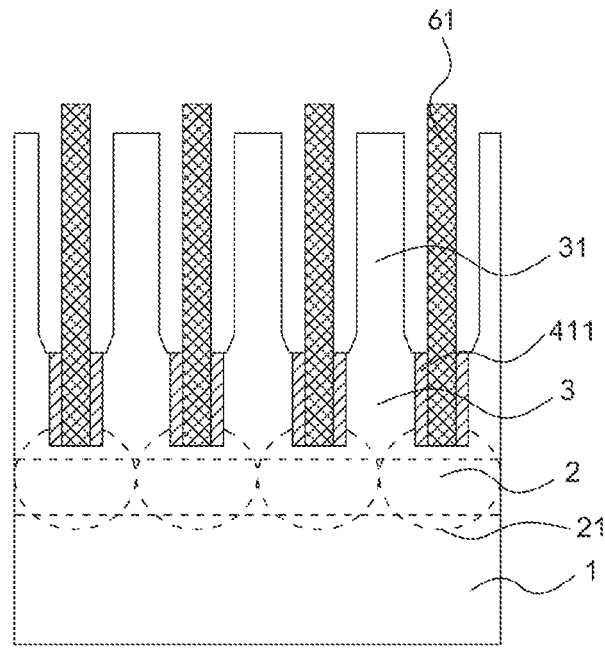
Figure 9:
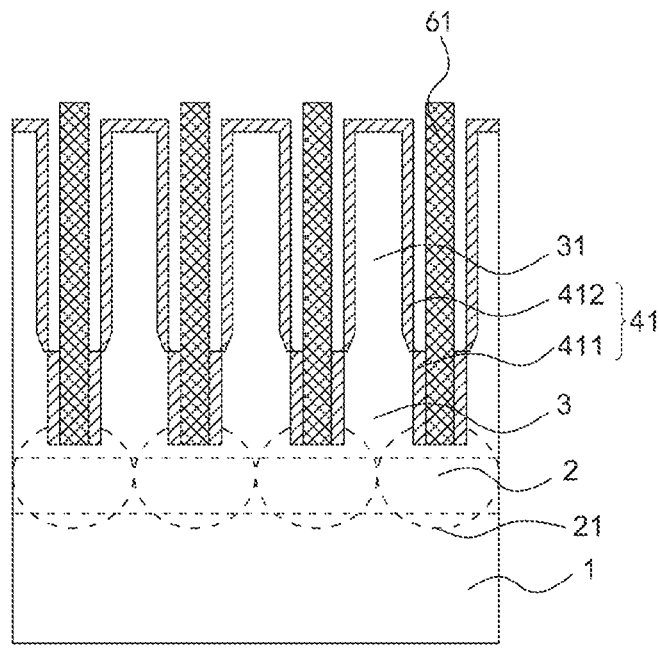

Step S401: forming a gate insulating layer 41 on a surface of the active pillar 3. As shown in FIG. 5, the first insulating layer 411 is formed on the surface of the active pillar 3. The first insulating layer 411 may be formed by means of a deposition process, such as chemical vapor deposition (CVD), atomic layer deposition (ALD), or physical vapor deposition (PVD). The first insulating layer 411 may include at least one of silicon oxide, silicon nitride, and silicon oxynitride. As shown in FIG. 6, a first spacer 61 is filled between the first insulating layers 411. The first spacer 61 may be silicon nitride or silicon oxynitride. The first spacer 61 is configured to insulate and isolate adjacent active pillars 3. Still referring to FIG. 6, in some embodiments, a height of the first spacer 61 is higher than that of the top surface of the active pillar 3. As shown in FIG. 7, the first insulating layer 411 is etched back to a first preset depth to expose a first part of the active pillar 3. The first insulating layer 411 may be etched back by means of a wet etching process or a dry etching process. The dry etching process may be a plasma etching process, an etching gas used in the plasma etching process may be chlorine, and an etching degree may be controlled by controlling a dosage of the etching gas. During the wet etching, concentrated sulfuric acid and hydrogen peroxide may be used as an etchant, and an etching degree may be controlled by adjusting a concentration of the etchant, to adjust a value of the first preset depth. The first preset depth may be set according to an actual situation of the semiconductor structure, which is not particularly limited herein. As shown in FIG. 8, a sidewall of the first part of the active pillar 3 is etched to form a first pillar 31, a critical size of the first pillar 31 is less than a critical size of another part of the active pillar 3, and next, the first pillar 31 is cleaned. As shown in FIG. 9, a second insulating layer 412 is formed on a surface of the first pillar 31, where the second insulating layer 412 and the first insulating layer 411 form the gate insulating layer 41. The second insulating layer 412 may be formed by means of a deposition process, such as CVD, ALD, or PVD. The second insulating layer 412 may include at least one of silicon oxide, silicon nitride, and silicon oxynitride. In some embodiments, the first insulating layer 411 and the second insulating layer 412 are formed by means of the same deposition process, and a material of the first insulating layer 411 is the same as a material of the second insulating layer 412, such that the processes can be simplified, and the first insulating layer 411 and the second insulating layer 412 are connected more stably.

Figure 10:
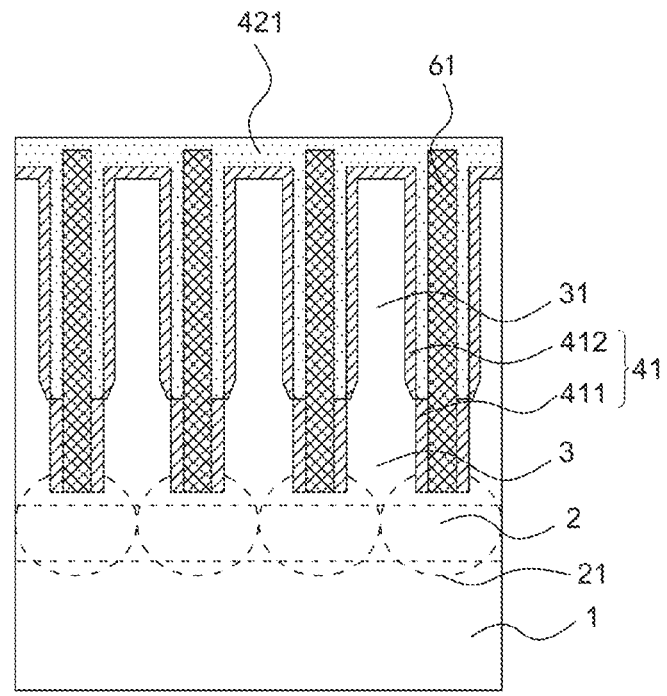
Figure 11:
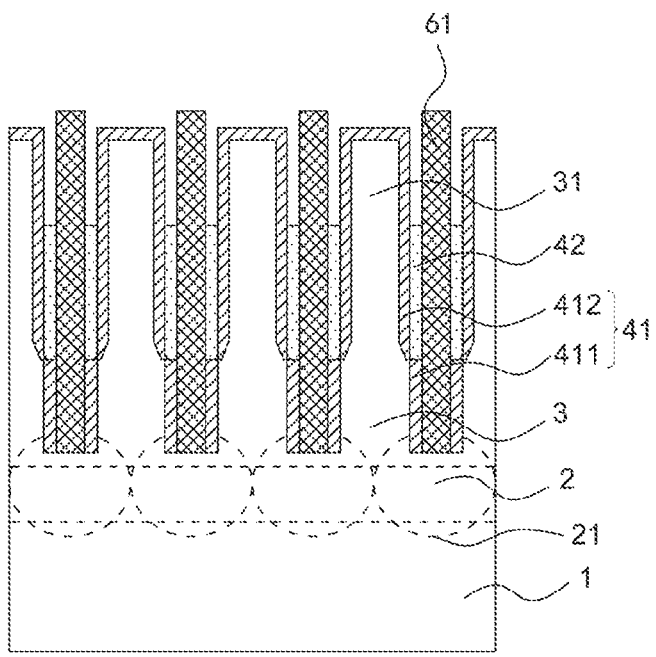

Step S402: forming a word line layer 42 surrounding a part of a side surface of the gate insulating layer 41. As shown in FIG. 10, a word line metal layer 421 is filled between adjacent second insulating layers 412. The word line metal layer 421 may be filled by means of a deposition process. A material of the word line metal layer 421 may include at least one of TiN, W, Al, Cu, and Au. As shown in FIG. 11, the word line metal layer 421 is etched back to a second preset depth, to form the word line layer 42. The word line layer 42 may serve as a gate electrode of the gate structure 4. The second preset depth may be set according to a required height of the gate electrode, which is not particularly limited herein.

Step S600: forming a spacer 6, where the spacer 6 is formed between adjacent gate structures 4 and adjacent active pillars 3, and a height of the spacer 6 is higher than that of a top surface of the metal silicide layer 5.

Figure 12:
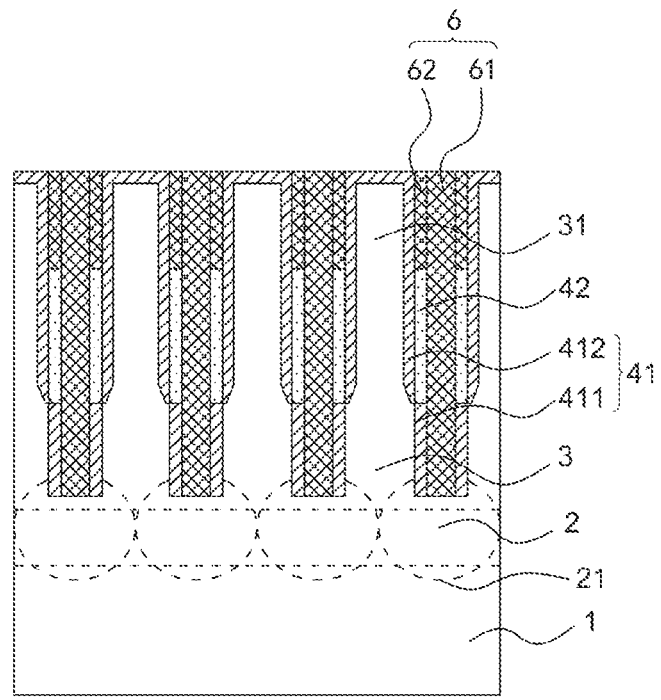

In some embodiments, the spacer 6 is formed between two adjacent active pillars 3 where the gate insulating layer 41 and the word line layer 42 are formed. As shown in FIG. 12, a second spacer 62 is formed between adjacent gate insulating layers 41 and formed on the word line layer 42, where the second spacer 62 and the first spacer 61 form the spacer 6. That is, the second spacer 62 is filled between adjacent active pillars 3 where the gate insulating layer 41 and the word line layer 42 are formed, such that the adjacent active pillars 3 are completely insulated and isolated from each other. The second spacer 62 may be silicon nitride or silicon oxynitride. In some embodiments, a top surface of the first spacer 61 is flush with that of the second spacer 62, such that the top surface of the spacer 6 formed by the first spacer 61 and the second spacer 62 is higher than that of the active pillar 3, to provide space to form the connection layer 7 subsequently. In some embodiments, the first spacer 61 and the second spacer 62 may be formed by means of the same process, for example, at least one of CVD, PVD, and ALD. A material of the first spacer 61 is the same as that of the second spacer 62, such that the processes can be simplified, and stability of connection between the first spacer 61 and the second spacer 62 can be improved.

In some embodiments, still referring to FIG. 12, after the second spacer 62 is formed, the top surface of the second spacer 62, the top surface of the first spacer 61, and the top surface of the second insulating layer 412 are flush with each other by means of a chemical mechanical polishing process, such that the top surface of the semiconductor structure in this step is planarized, to facilitate subsequent processing.

Figure 13:
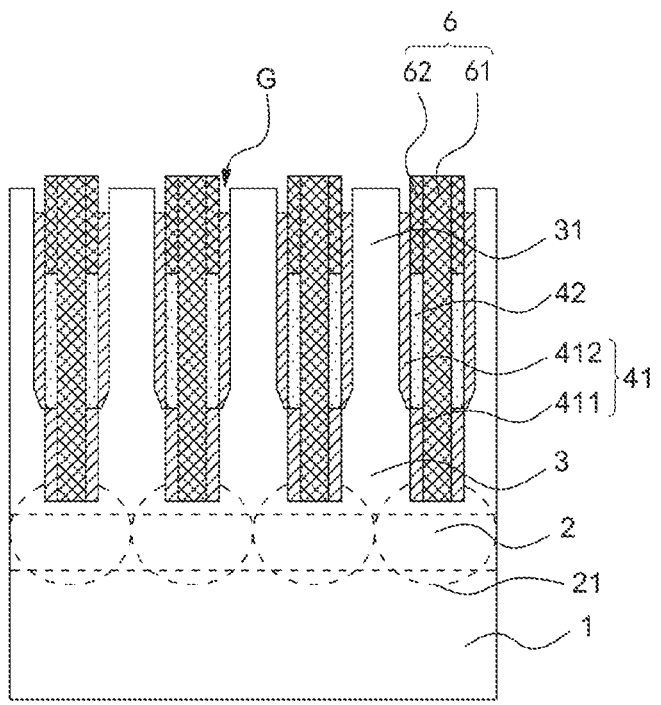

In some embodiments, as shown in FIG. 13, the method further includes: removing the second insulating layer 412 on a top surface of the first pillar 31 to expose the top surface of the first pillar 31.

In some embodiments, as shown in FIG. 13, the removing the second insulating layer 412 on a top surface of the first pillar 31 includes: etching back the second insulating layer 412 to remove the second insulating layer 412 on the top surface of the first pillar 31, and etching back the second insulating layer 412 on a side surface of the first pillar 31 to a third preset depth, such that the top surface of the gate insulating layer 41 is lower than that of the first pillar 31 in the direction perpendicular to the substrate 1. That is, a groove G is formed on a periphery of a top of the active pillar 3. A depth of the groove G is the third preset depth. The third preset depth may be set according to an actual situation, which is not particularly limited herein. In a subsequent process, a first metal layer 51 is formed on the active pillar 3, and stability of the first metal layer 51 is improved by means of the groove G.

The third preset depth is 5 nm to 40 nm. In some embodiments, other than the two end values of the above range, a value of the third preset depth may be 25 nm, 30 nm, 35 nm, or 38 nm, or the third preset depth may vary in the range of 5 nm to 40 nm with different positions. That is, each groove G does not have a uniform depth, and each groove G may have different depths at different positions. Persons skilled in the art may select a value of the third preset depth according to an actual need, which is not particularly limited herein.

In some other embodiments, the removing the second insulating layer 412 on a top surface of the first pillar 31 includes: etching and removing the second insulating layer 412 only on the top surface of the first pillar 31 without further etching the second insulating layer 412 downward. That is, it is not required to form the groove G in the foregoing embodiment. In this way, the processes can be simplified and time can be saved.

Step S800: forming a metal silicide layer 5, where the metal silicide layer 5 is positioned on the top surface of the active pillar 3, and a projection of the metal silicide layer 5 on the substrate 1 is overlapped with a projection of the top surface of the active pillar 3 on the substrate 1.

In some embodiments, Step S800 may include Steps S801 to S803.

Figure 14:
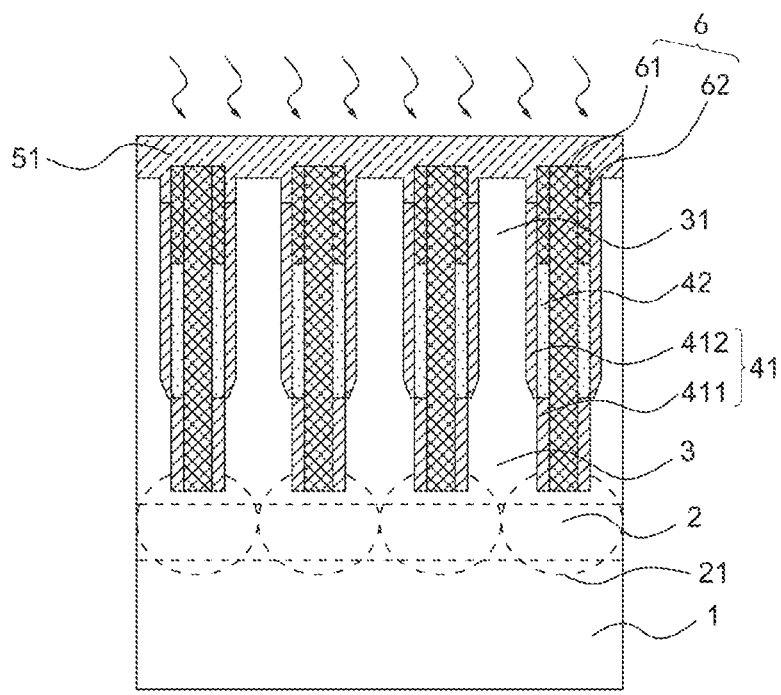

Step S801: forming a first metal layer 51 on the top surface of the active pillar 3, as shown in FIG. 14. The first metal layer 51 may be formed on the top surface of the active pillar 3 by means of a deposition process, where the first metal layer may be at least one of Co, Ni, Pt, Ti, Ta, Mo, and W; and the deposition process may be PVD.

Figure 15:
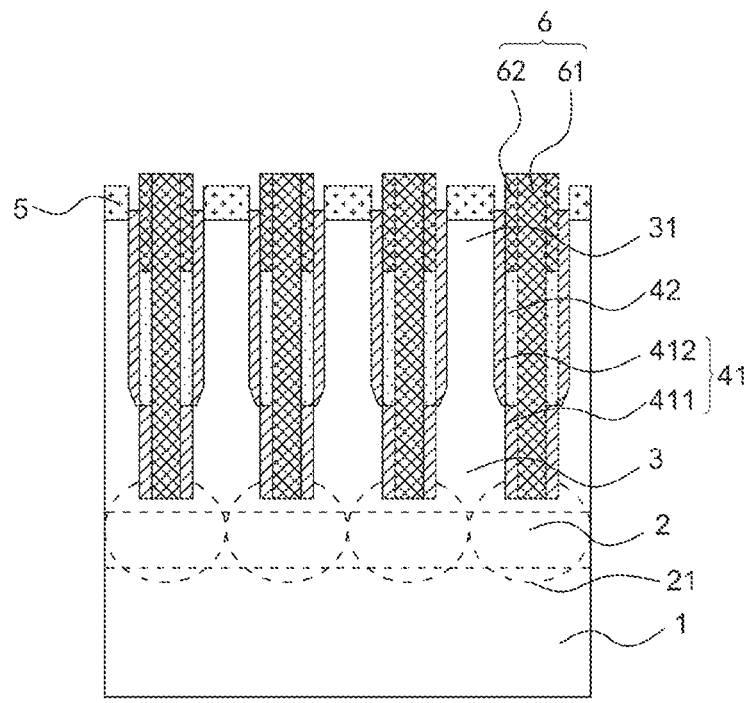

Step S802: performing heat treatment on the active pillars 3 to form the metal silicide layer 5 on a top of the active pillar 3, as shown in FIG. 14 and FIG. 15. The heat treatment may be annealing, such that metal of the first metal layer 51 reacts with the active pillar 3, and the top of the active pillar 3 is doped with a metal silicide, such as $CoSi_x$, $NiSi_x$, or $TiSi_x$, to form the metal silicide layer 5. Because the top of the active pillar 3 has the metal silicide, the resistance of the top of the active pillar 3 is reduced, and the contact resistance between the active pillar 3 and pad metal is reduced. An annealing temperature may be 400° C. to 1,000° C. In some embodiments, other than the two end values of the temperature range, the annealing temperature also may be 500° C., 600° C., 700° C., 800° C., or 900° C., or the annealing temperature varies in the range of 400° C. to 1,000° C., which is not particularly limited herein. Steps S801 and S802 are Salicide process, which does not need a lithography patterning process to form the metal silicide, thereby simplifying the fabrication processes.

Step S803: removing a remaining part of the first metal layer 51, as shown in FIG. 15. In some embodiments, the remaining part of the first metal layer 51 may be removed by means of an etching process. The etching process may be wet etching or dry etching, which may be selected by persons skilled in the art according to an actual situation, which is not particularly limited herein.

Figure 16:
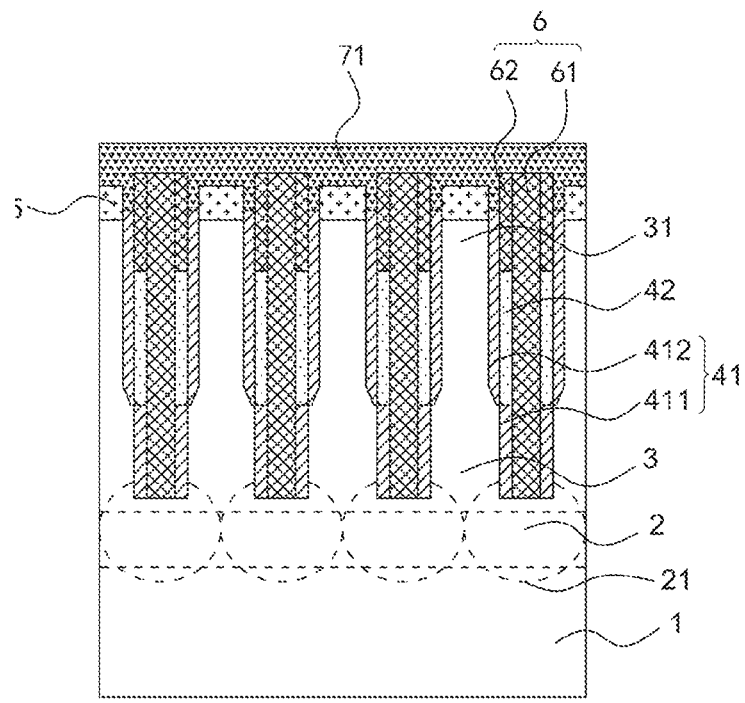

In some embodiments, as shown in FIG. 16, the method for fabricating a semiconductor structure provided by the present disclosure further includes: forming a connection material layer 71 on a top surface of the metal silicide layer 5, on a top surface of the gate structure 4, and on a top surface of the spacer 6.

In some embodiments, as shown in FIG. 16, the groove G is formed on the periphery of the top of the active pillar 3 in Step 604, and a bottom of the connection material layer 71 is formed in the groove G, which improves stability of the connection material layer 71.

Figure 17:
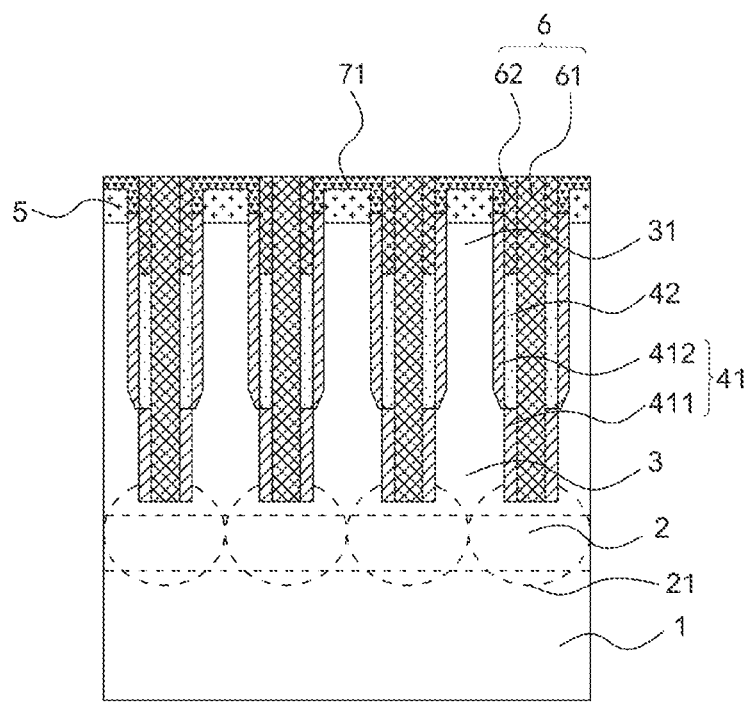

In some embodiments, as shown in FIG. 17, the method for fabricating a semiconductor structure in the embodiments of the present disclosure further includes: removing a part of the connection material layer 71 to expose the spacer 6, where a remaining part of the connection material layer 71 forms the connection layer 7, and a top surface of the connection layer 7 is flush with that of the spacer 6.

In some embodiments, this part of the connection material layer 71 is removed by means of a chemical mechanical polishing process to form the connection layer 7, such that the top surface of the connection layer 7 is flush with that of the spacer 6. In this way, the connection layers 7 above adjacent active pillars 3 can be insulated and isolated from each other, and the surface of the semiconductor structure can be planarized, which facilitates arrangement of the memory cell.

A projection of the connection layer 7 on the substrate 1 covers a projection of the metal silicide layer 5 on the substrate 1, such that the connection layer 7 is in full contact with the metal silicide layer 5. The connection layer 7 may be understood as a metal pad, which is electrically connected to the metal silicide layer 5 to electrically connect the active pillar 3 to a memory cell (not shown in the figure) positioned above the metal pad. A material of the connection layer 7 is at least one of TiN, W, Al, Cu, and Au. Still referring to FIG. 17, a bottom surface of the groove G is higher than that of the metal silicide layer 5, to prevent contact between the connection layer 7 and a part of the active pillar 3, such that the connection layer 7 is in full contact with the metal silicide layer 5, which reduces the contact resistance, increases the contact area between the connection layer 7 and the metal silicide layer 5, and improves the operating speed of the semiconductor structure.

In some embodiments, before Step S400, the method may further include Step S300: forming bit lines 2 positioned in the substrate 1, where the bit lines 2 are arranged at intervals along the second direction F2. As shown in FIG. 1, the second direction F2 is not parallel to the first direction F1. For example, the second direction F2 is perpendicular to the first direction F1.

In some embodiments, the forming bit lines 2 may include Steps S301 to S304.

Step S301: forming the bit lines 2 in the substrate 1 between the active pillars 3 along the second direction F2. In some embodiments, impurity ions may be doped into the substrate 1 positioned between the active pillars 3 along the second direction F2 by means of an ion implantation process, to form the bit lines 2, or the impurity ions may be doped into the substrate 1 positioned below the active pillars 3, to form the bit lines 2.

Step S302: forming a second metal layer on the bit line 2. In some embodiments, a metal layer may be formed above the bit line 2 by means of a deposition process. As shown in FIG. 4, the second metal layer is deposited on a surface of a region corresponding to a dashed ellipse. The second metal layer may be at least one of Co, Ni, Pt, Ti, Ta, Mo, and W; and the deposition process may be PVD.

Step S303: performing heat treatment on the substrate 1 to form the bit line 2 doped with the metal silicide. In some embodiments, the heat treatment may be annealing, such that metal of the second metal layer reacts with silicon of the bit line 2 to form the bit line 2 doped with the metal silicide, where the metal silicide is positioned in a metal silicide region 21 shown in FIG. 4. Because the bit line 2 has the metal silicide such as $CoSi_x$, $NiSi_x$, or $TiSi_x$, the resistance of the bit line 2 is reduced. An annealing temperature may be 400° C. to 1,000° C. In some embodiments, other than the two end values of the temperature range, the annealing temperature also may be 500° C., 600° C., 700° C., 800° C., or 900° C., or the annealing temperature varies in the range of 400° C. to 1,000° C., which is not particularly limited herein. Steps S402 and S403 are a Salicide process, which does not need a lithography patterning process to form the metal silicide, thereby simplifying the fabrication processes.

Step S304: removing a remaining part of the second metal layer. In some embodiments, the remaining part of the second metal layer may be removed by means of an etching process. The etching process may be wet etching or dry etching, which may be selected by persons skilled in the art according to an actual situation, which is not particularly limited herein.

In some embodiments, the metal silicide in the bit line 2 has the same metal element as the metal silicide layer 5, which can simplify the processes and reduce the energy consumption.

To sum up, in the method for fabricating a semiconductor structure in the embodiments of the present disclosure, the metal silicide layer 5 is formed on the top surface of the active pillar 3, such that the top of the active pillar 3 has smaller resistance. In this way, the contact resistance between the active pillar 3 of the present disclosure and the metal pad is reduced, the energy consumption is reduced, and the operating speed of the semiconductor structure is improved.

According to another aspect of the present disclosure, a semiconductor device is provided, which includes the semiconductor structure according to any one of the foregoing embodiments and a memory cell, where the memory cell is electrically connected to the semiconductor structure by means of the connection layer 7. The semiconductor structure and the connection layer 7 are the same as those in the foregoing embodiment, and details thereof are not repeated herein.

In the semiconductor device in the embodiments of the present disclosure, because the active pillar 3 in the semiconductor structure has the metal silicide layer 5, which has smaller contact resistance, the operating speed of the semiconductor device can be improved, and the energy consumption can be reduced.

It is to be understood that the present disclosure does not limit its application to the detailed structure and arrangement of the components proposed in this specification. The present disclosure can have other embodiments and can be implemented and carried out in various ways. The foregoing variations and modifications fall within the scope of the present disclosure. It is to be understood that the present disclosure disclosed and defined in this specification extends to all fungible combinations of two or more individual features that are mentioned or apparent from the text and/or drawings. All of these different combinations constitute various fungible aspects of the present disclosure. The embodiments described herein explain the best modes known for practicing the present disclosure and will enable those skilled in the art to utilize the present disclosure.

What is claimed is:

1. A method for fabricating a semiconductor structure comprising:
    providing a substrate, active pillars being arranged in an array on the substrate, and the active pillars extending along a direction perpendicular to the substrate;
    forming gate structures positioned on the substrate, the gate structures being arranged at intervals along a first direction, and being arranged surrounding a part of the active pillar;
    forming a spacer, the spacer being formed between adjacent two of the gate structures and adjacent two of the active pillars, and a height of the spacer being higher than a height of a top surface of the active pillar; and
    forming a metal silicide layer, the metal silicide layer being positioned on the top surface of the active pillar, and a projection of the metal silicide layer on the substrate being overlapped with a projection of the top surface of the active pillar on the substrate;
    wherein the forming gate structures comprises:
        forming a gate insulating layer on a surface of the active pillar; and
        forming a word line layer surrounding a part of a side surface of the gate insulating layer; and
    wherein the forming the gate insulating layer on the surface of the active pillar comprises:
        forming a first insulating layer on the surface of the active pillar;
        filling a first spacer between the first insulating layers;
        etching back the first insulating layer to a first preset depth, to expose a first part of the active pillar;
        etching a sidewall of the first part to form a first pillar; and
        forming a second insulating layer on a surface of the first pillar, the second insulating layer and the first insulating layer forming the gate insulating layer.

2. The method according to claim 1, wherein the forming a word line layer surrounding a part of a side surface of the gate insulating layer comprises:
    filling a word line metal layer between adjacent two of the second insulating layers; and
    etching back the word line metal layer to a second preset depth, to form the word line layer.

3. The method according to claim 2, wherein the forming a spacer comprises:
    forming a second spacer between adjacent two of the gate insulating layers and forming the second spacer on the word line layer, the first spacer and the second spacer forming the spacer.

4. The method according to claim 3, wherein after the second spacer is formed, a top surface of the first spacer, a top surface of the second spacer, and a top surface of the second insulating layer are flush with each other by means of a chemical mechanical polishing process.

5. The method according to claim 4, further comprising:
    removing the second insulating layer on a top surface of the first pillar to expose the top surface of the first pillar.

6. The method according to claim 5, wherein the removing the second insulating layer on a top surface of the first pillar comprises:
    etching back the second insulating layer to remove the second insulating layer on the top surface of the first pillar, and etching back the second insulating layer on a side surface of the first pillar to a third preset depth.

7. The method according to claim 6, wherein the third preset depth is 5 nm to 40 nm.

8. The method according to claim 5, wherein the removing the second insulating layer on a top surface of the first pillar comprises: etching and removing the second insulating layer only on the top surface of the first pillar.

9. The method according to claim 1, wherein the forming a metal silicide layer comprises:
    forming a first metal layer on the top surface of the active pillar;
    performing heat treatment on the active pillar to form the metal silicide layer on a top of the active pillar; and
    removing a remaining part of the first metal layer.

10. The method according to claim 1, further comprising:
    forming a connection material layer on a top surface of the metal silicide layer, on a top surface of the gate structure and on a top surface of the spacer; and
    removing a part of the connection material layer to expose the spacer, a remaining part of the connection material layer forming a connection layer, and a top surface of the connection layer being flush with the top surface of the spacer.

* * * * *